(12) United States Patent
Tetzlaff et al.

(10) Patent No.: US 8,726,107 B2
(45) Date of Patent: May 13, 2014

(54) MEASUREMENT OF LATENCY IN DATA PATHS

(75) Inventors: David Erich Tetzlaff, Minnetonka, MN (US); Mathew Power Vea, Shrewsbury, MA (US)

(73) Assignee: Seagate Technology LLC, Cupertino, CA (US)

( * ) Notice: Subject to any disclaimer, the term of this patent is extended or adjusted under 35 U.S.C. 154(b) by 334 days.

(21) Appl. No.: 13/183,611

(22) Filed: Jul. 15, 2011

(65) Prior Publication Data

US 2013/0019131 A1   Jan. 17, 2013

(51) Int. Cl.
*G11C 29/00* (2006.01)

(52) U.S. Cl.
USPC ........................................................ 714/719

(58) Field of Classification Search
CPC .................. G11B 20/10222; G11B 2220/2516
USPC .................... 714/719, 799, 746; 702/85, 179; 360/31, 67, 68
See application file for complete search history.

(56) References Cited

U.S. PATENT DOCUMENTS

| | | | |
|---|---|---|---|
| 5,384,671 A | 1/1995 | Fisher | |
| 6,810,485 B2 | 10/2004 | McEwen et al. | |
| 7,236,324 B2 | 6/2007 | Albrecht et al. | |
| 7,236,325 B2 | 6/2007 | Albrecht et al. | |
| 7,590,013 B2 * | 9/2009 | Yu et al. | 365/194 |
| 7,876,517 B2 | 1/2011 | Buch et al. | |
| 2006/0256464 A1 | 11/2006 | Ozdemir | |
| 2008/0002269 A1 | 1/2008 | Sakurai et al. | |
| 2012/0278022 A1 * | 11/2012 | Kan et al. | 702/85 |

* cited by examiner

*Primary Examiner* — Phung M Chung
(74) *Attorney, Agent, or Firm* — Cesari & Reed, LLP; Kirk A. Cesari; David K. Lucente

(57) ABSTRACT

This disclosure is related to measurement of latency in data paths. A latency measurement may be accomplished by calculating a roundtrip write-to-read latency based on generating a write signal and receiving a read signal approximately simultaneously. The read signal may be based on a coupling between a write element and read element. A device setting may then be adjusted based on the calculated roundtrip write-to-read latency. Further, a read/write mechanism that is used to write user data to and read user data from a data storage medium may be used to determine the roundtrip write-to-read latency. Even further, the roundtrip write-to-read latency may be determined in real-time as the data storage device is in operation.

20 Claims, 8 Drawing Sheets

8,726,107 B2

MEASUREMENT OF LATENCY IN DATA PATHS

BACKGROUND

The present disclosure is generally related to data storage devices, write latency, and read latency. A data storage device that includes a read head or a write head may experience a latency from the write data path to the write head or a latency from the read head to the read data path. Such latencies can vary based on environmental effects, such as temperature, humidity, and supply voltage. When a latency varies, a write timing or read timing may be incorrect, which may create errors or other problems when attempting to read or write data. The systems and methods described herein present solutions to these and other problems.

SUMMARY

The present disclosure is related to systems and method of measurement of latency in data paths. In one example, a device can include a write mechanism to write user data to a data storage medium and a read mechanism to read user data from a data storage medium. The device may also include a circuit adapted to calculate a roundtrip write-to-read latency based on generating a write signal to the write mechanism and receiving a read signal via the read mechanism approximately simultaneously and adjust a device setting based on the calculated roundtrip write-to-read latency.

In another example, a method may include applying a write signal to a write data path for writing data to a data storage medium, receiving a read signal via a read data path, the read signal generated at least partially due to coupling between the read data path and the write data path, calculating a combined latency of the write data path and the read data path based on applying the write signal to the write data path and receiving the read signal at the read data path approximately simultaneously, and adjusting a device setting based on the combined latency.

In yet another example, a system may include a data storage medium, a write element adapted to store data to the data storage medium, and a read element adapted to read data from the data storage medium. The system may also include a circuit adapted to calculate a roundtrip latency based on applying a write signal to the write element and receiving a read signal via the read element approximately simultaneously. The read signal may be generated at least partially due to coupling between the write element and the read element. The circuit may also be adapted to adjust a setting of the data storage device based on the calculated roundtrip latency.

DETAILED DESCRIPTION

In the following detailed description of the embodiments, reference is made to the accompanying drawings which form a part hereof, and in which are shown by way of illustration of specific embodiments. It is to be understood that other embodiments may be utilized and structural changes may be made without departing from the scope of the present disclosure.

Figure 1:
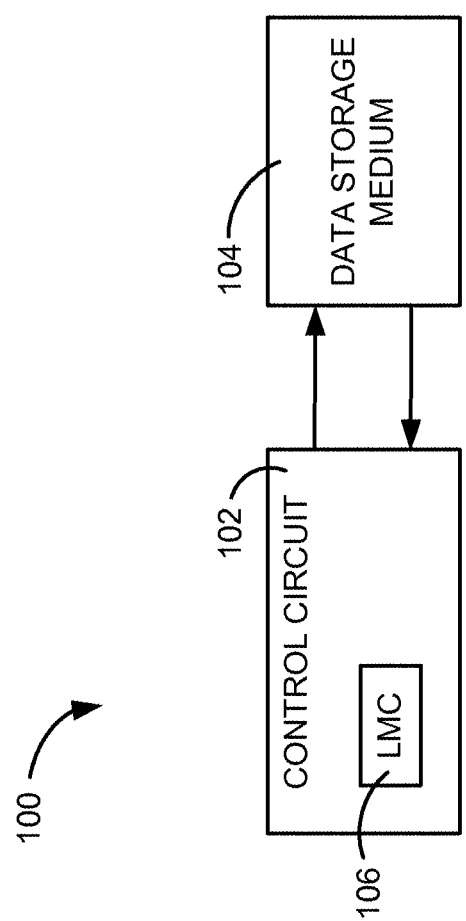
FIG. 1 is a diagram of an illustrative embodiment of a system for measurement of latency.

Referring to FIG. 1, a particular embodiment of a system for measurement of latency is shown and generally designated 100. The system 100 can include a control circuit 102 and data storage medium 104. The control circuit 102 may be an electronic circuit capable of measuring latency in a data path. The control circuit 102 may comprise a controller, hardware logic, discrete electronics, a field programmable gate array (FPGA), an application specific integrated circuit (ASIC), software or firmware, or any combination thereof. The data storage medium 104 may be a disc data storage medium or any other type of data storage medium that has an associated latency in a read path, a write path, or both. In addition, the data storage medium 104 may include more than one data storage medium and more than one type of data storage medium, such as in a hybrid data storage device.

The control circuit may further include a latency measurement circuit 106. The latency measurement circuit (LMC) 106 may be adapted to determine a roundtrip write-to-read latency (also referred to as the "roundtrip latency" or the "combined latency") associated with storing data to the data storage medium 104. The roundtrip write-to-read latency may then be used to adjust one or more settings of the device associated with the data storage medium, such as updating a write phase of a write element.

In some embodiments, the LMC 106 may determine the roundtrip latency by applying a write current to a write mechanism for writing data to the data storage medium 104 and initiating a data reading mechanism for reading data from the data storage medium approximately simultaneously such that the read mechanism can sense a signal from the write mechanism while the write mechanism is activated. In a particular embodiment of a data storage device having a write element and a read element on a read/write head, the LMC 106 uses a read/write head that can be used to write user data to the data storage medium 104 to measure the round trip write-to-read latency due to coupling between the read element and the write element.

The LMC 106 may determine the roundtrip latency based on applying the write current and initiating the data reading approximately simultaneously. In an example with a read/write head, the LMC 106 can determine the roundtrip latency by utilizing coupling in the head such that a read mechanism can sense a write signal due to coupling between a write mechanism and the read mechanism.

Once a roundtrip latency is calculated, the LMC 106 may adjust a device setting based on the calculated roundtrip latency. The device setting may be a timing correction for writing data to the data storage medium 104. For example, bit patterned media can require precise timing of a write signal relative to a dot position under a write head for the correct writing of data and the loopback path calibration can frequently, without degrading performance of the data storage device, update a timing correction to be applied to write data.

The device setting that may be adjusted may be one of many device settings that may be affected by variations in latency; for example, a write phase at a write head can be affected by changes in latency. In addition, changes in a latency can affect a sensed location of the head. Thus, measuring the roundtrip latency can allow for the simultaneous correction of both of these latency variations, among others.

Figure 2:
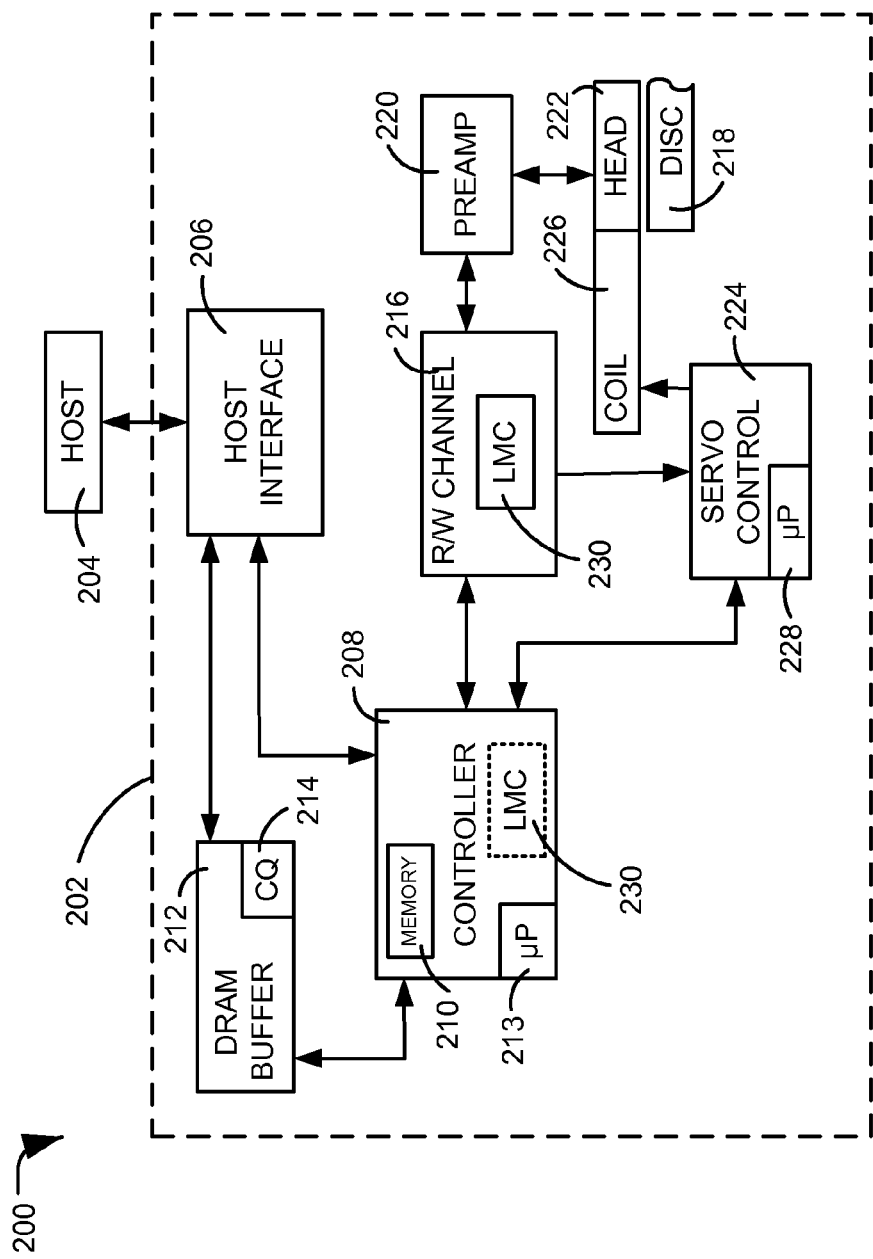
FIG. 2 is a diagram of an illustrative embodiment of a data storage system for measurement of latency.

Referring to FIG. 2, a particular embodiment of a data storage system for measurement of latency is shown and generally designated 200. Specifically, FIG. 2 shows a particular embodiment of a functional block diagram of a data storage device 202 that includes a system for measurement of latency and, in particular, measurement of roundtrip latency. The data storage device 202 can communicate with a host device 204 via a hardware/firmware based interface circuit 206 that may include a connector that allows the data storage device 202 to be physically removed from the host 204. The data storage device 202 may include a programmable controller 208 with associated memory 210 and processor 213. The programmable controller 208 may be coupled to a buffer 212 that can temporarily store user data during read and write operations and can include a command queue (CQ) 214 where multiple pending operations can be temporarily stored pending execution.

Further, FIG. 2 further shows the data storage device 202 to include a read/write (R/W) channel 216 which can encode data during write operations and reconstruct data retrieved from disc(s) 218 during read operations. A preamplifier/driver circuit (preamp) 220 can apply write currents to head (s) 222 and can provide pre-amplification of readback signals from a head 222, which can include a write mechanism (or element) and a read mechanism (or element). A servo control circuit 224 can use servo data to provide an appropriate current to a coil 226 to position the head(s) 222. The controller 208 can communicate with a processor 228 to move the head(s) 222 to desired locations on the disc(s) 218 during execution of various pending commands from the command queue 214.

In a particular embodiment, the data storage device 202 may also include a latency measurement circuit (LMC) 230 that may be adapted to calculate a roundtrip write-to-read latency. The LMC 230 may be adapted to apply a write signal via the write mechanism and receive a read signal via the read mechanism approximately simultaneously. For example, the roundtrip latency may be based on initiating a signal through a write channel and detecting the signal via a read channel, such that the read mechanism and write mechanism are activated simultaneously, or nearly simultaneously.

The LMC 230 may be located in the R/W channel 216, in the controller 208, or elsewhere in the data storage device 200. The LMC 230 may comprise a controller, hardware logic, discrete electronics, a field programmable gate array (FPGA), an application specific integrated circuit (ASIC), software or firmware, or any combination thereof.

The LMC 230 can determine the roundtrip latency by utilizing coupling in a head 222, such as when a head 222 is over a calibration region of the disc 218, to sense coupling in the head between a write element and a read element. Once the roundtrip latency is calculated, the LMC 230, the controller 208, or other electronics may adjust a setting of the data storage device 202 based on the calculated roundtrip latency. The device setting may be a timing correction for writing data to the disc 218. For example, bit patterned media can require precise timing of a write signal relative to a dot position under a write head for the correct writing of data and the loopback path calibration can frequently, without degrading performance of the data storage device, update a timing correction to be applied to write data.

The device setting may also be a write phase of a write head that can be updated based on the determined roundtrip latency. For example, a write phase at a write head can be affected by changes in a write channel to write head latency. In addition, changes in a read head to read channel latency can affect a sensed location of the head. Thus, measuring the roundtrip latency can allow for the simultaneous correction of both of these variations.

The LMC 230 may perform the roundtrip latency measurement when the head 222 is over a calibration field, which may include a quiet field. Generally, the calibration field is an area of the disc 218 that is vacant or not used for purposes other testing and calibrations. Further, a quiet field may be an area of a data storage medium that is reserved not to be used for storage of user data or other data received from a host. A calibration field may be an area of the data storage medium that is reserved for this calibration test. Dedicating such segment allows the roundtrip latency to be made as often as wanted without corrupting or degrading the data storage device. The determination of roundtrip latency may be calculated variably, during certain operations, or by command. Thus, the roundtrip latency and updating associated with the roundtrip latency may be done in real-time during operation of a data storage device. Further, the data storage device 202 may use the calibration field and the quiet field for other purposes in addition to those described herein.

The data storage medium 218 can comprise tracks having a track format that includes the calibration field and the quiet field near the calibration field. A spacing between the calibration field and the quiet field may be based on a spacing between a write mechanism and a read mechanism; however, in some instances, the calibration field and the quiet field could be adjacent. The write-to-read latency can be calculated every time, almost every time, or a selected number of times when the write mechanism is over the calibration field and the read mechanism is over the quiet field. Therefore, based on the placement of the calibration fields, the roundtrip latency can be calculated one or more times per revolution of the disc(s) 218 and can use the head(s) 222 that are also be used to write user data to the disc(s) 218. Because the calibration fields and quiet fields do not contain user data, the measurement of the roundtrip latency should not corrupt any user data. In some embodiments, the quiet field may be prewritten with a pattern, such as a direct current (DC) pattern having no magnetic inversion. In a particular embodiment, the disc(s) 218 can include bit patterned media.

In some embodiments, the calibration field can exist in multiple adjacent tracks of a disc 218 to create a wedge on the disc 218. For example, the calibration field can exist in all, or almost all, tracks on the disc 218 such that it creates a coherent wedge on the disc 218. However, a wedge is not required, but placing the calibration fields in a wedge allows the calibration to be performed independent of cross-track location. Thus, by predefining and arranging the calibration fields to form a wedge on the disc 218, the roundtrip measurement operation can be performed at any crosstrack position, including during a seek when the crosstrack position may be rapidly changing. However, the calibration field may occur once on a track, or once for each servo wedge, at any frequency between these two examples, or at any other desired frequency.

In some embodiments, the roundtrip latency may be calculated during an operation of the data storage device initiated by the host 204, such as a write or seek operation. Determining the roundtrip latency may occur during writing of user data received from the host 204, where the data is not internal data storage device test data. The roundtrip latency can then be calculated based on a data pattern of the user data rather than a predefined calibration pattern. For example, a more accurate measurement of the roundtrip latency can be made using the actual head that will be used to write user data received from the host, than using a dummy head that is only used for calibration and not used to write user data.

Figure 3:
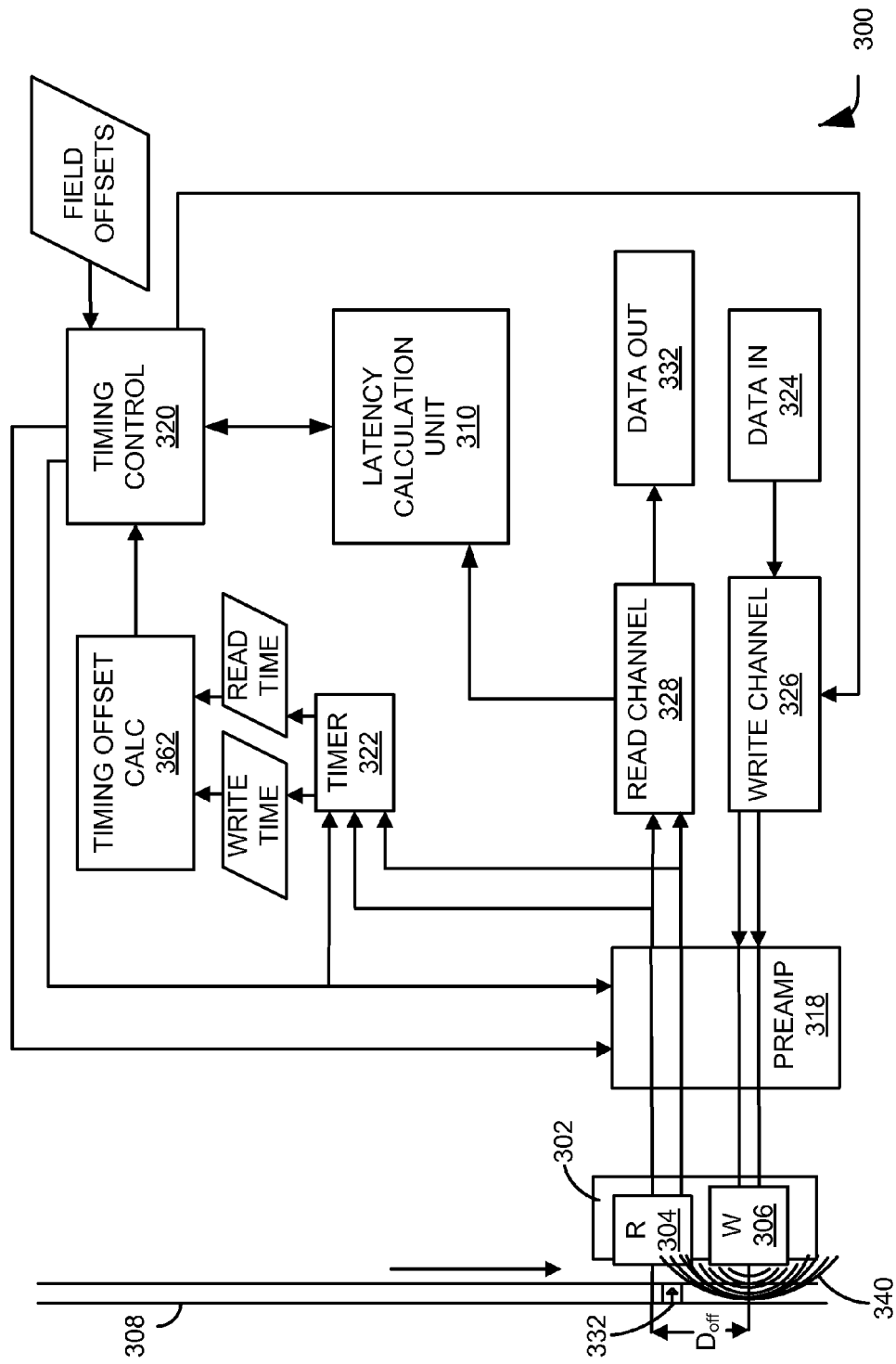
FIG. 3 is a diagram of another illustrative embodiment of a data storage system for measurement of latency.

Referring to FIG. 3, another particular embodiment of a data storage system for measurement of latency is shown and generally designated 300. FIG. 3 provides a block diagram of elements within a storage device that can be used to write or read data from a data storage medium. The system 300 may include a head 302 having a read element 304 and a write element 306 to read and write data, respectively, to a data storage medium 308, such as a magnetic disc. The system 300 may further include a preamp 318 to drive read and write signals to or from the head 302, which may be controlled via a timing control 320, and a timer 322 to provide a timing input to the timing control 320. Further, the system 300 may include a data buffer 324, a write channel 326, a read channel 328, and a data buffer 332.

When timing control module 320 applies a write gate signal to preamp 318, data from the data queue 324 is processed by the write channel 326 and converted into a write signal by preamp 318. A write signal can drive a current through write element 306 in one of two directions. This current can cause the write element 306 to produce a magnetic field 340 that passes into medium 308, altering a magnetic moment of one or more magnetic domains, such as magnetic domain 332.

When timing control module 320 applies a read gate signal to preamp 318, a read signal generated by the read element 304 is amplified by preamp 318 to form an amplified read signal. The read signal can include an electrical signal that is formed by read element 304 as it detects a change in the magnetic moment of domains moving under it. The amplified read signal can be provided to the read channel 328, which can modify the read signal so that it has desired characteristics. The modifications can include, for example, adjusting the amplitude of the read signal using an automatic gain control, DC offsets to adjust for noise in the read signal, error correction, and pulse shaping to adjust the read signal to match a desired read channel characteristic. Those skilled in the art will recognize that not all of these modifications may be necessary and further that other modifications to the signal may be performed in read channel 328.

Read element 304 may be separated from write element 306 by a down-track or circumferential distance, $D_{offset}$, and, in some instances, by a cross-track or radial distance (not shown). Because of these physical offsets, read element 304 can pass a position on the data storage medium at a different time from when write element 306 passes the same position. Since timing timer 322 receives the position of the read element 304 and not the position of write element 306, timing offset calculator 362 can estimate a timing offset between the read element and the write element in order to properly apply the write gate signal and write data signals.

In a particular embodiment, the system 300 may also include a latency calculation unit 310 that may calculate a roundtrip write-to-read latency. The latency calculation unit 310 may be a controller, hardware logic, discrete electronics, a field programmable gate array (FPGA), an application specific integrated circuit (ASIC), software or firmware, or any combination thereof. The roundtrip latency may be calculated based on applying a write signal via the write mechanism and obtaining a read signal via the read mechanism approximately simultaneously. The read element 304 and write element 306 can be activated simultaneously, or nearly simultaneously, to allow the write element 306 to receive a signal based on the coupling 340 between the write element 306 and the read element 304.

The roundtrip latency may be calculated based on the time a signal takes to propagate between a component, such as a latch (not shown) or clock (not shown), in the write channel 326 to a component of the read channel 328. For example, the component in the read channel 328 may be an analog front end (not shown) or an analog to digital converter (ADC) (not shown).

Once the roundtrip latency is calculated, the latency calculation unit 310, the timing control 320, or other electronics may adjust a setting of the system 300 based on the calculated roundtrip latency. The device setting may be a timing correction for writing data to the medium 308. For example, bit patterned media can require precise timing of a write signal relative to a dot position under a write head for the correct writing of data and the loopback path calibration can frequently, without degrading performance of the data storage device, update a timing correction to be applied to write data. In a bit patterned media application, a calculated latency value can be used to adjust the phase of the write clock, where the write clock can be equal to a disc locked clock after adjustment for the write to read phase difference.

Figure 4:
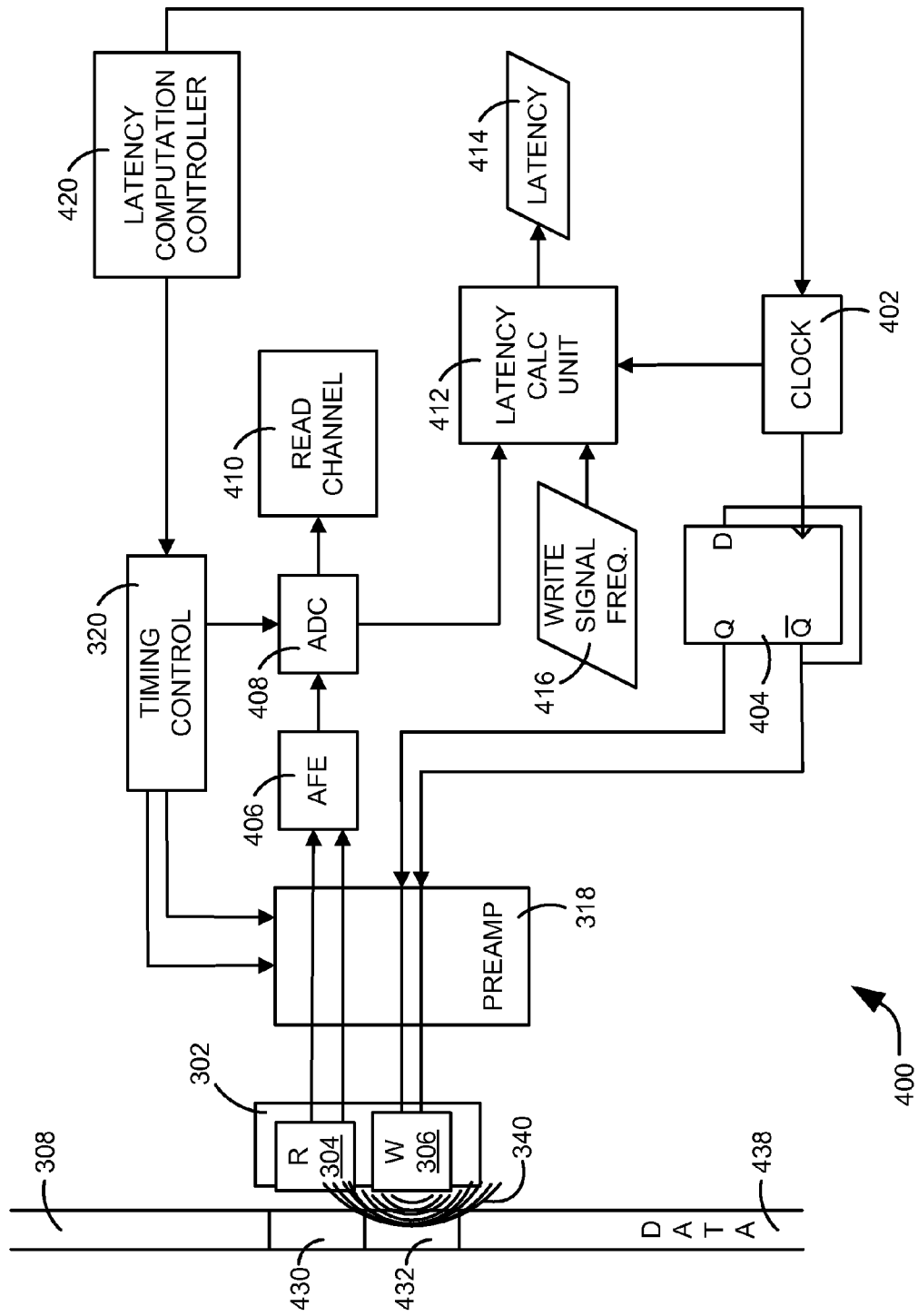
FIG. 4 is a diagram of another illustrative embodiment of a data storage system for measurement of latency.

Referring to FIG. 4, yet another particular embodiment of a data storage system for measurement of latency is shown and generally designated 400. System 400 can include a latency computation controller 420, a clock 402, a flip-flop 404, a latency calculator unit 412, an analog front end (AFE) 406, an analog to digital converter (ADC) 408, and a read channel 410.

The system 400 may also include the medium 308, the head 302 having read element 304 and write element 306, the preamp 318 and the timing control unit 320. The medium 308 may further include a quiet field 430, a calibration field 432, and data field(s) 438. The calibration field 432 and the quiet field 430 can be located in a relationship to each other that is based on a spacing between the write element 306 and the read element 304.

In a particular embodiment, the latency calculation unit 412 may calculate a roundtrip write-to-read latency based on a write signal generated through the write element 306 and a read signal received via the read element 304, where the write signal is generated as the read signal is received. For example, the read element 304 and write element 306 can be activated simultaneously, or nearly simultaneously, to allow the read element 304 to sense a signal based on the coupling 340 between the write element 306 and the read element 304. The system 400 may adjust a device setting, such as write data phase of a write signal or a timing for a write gate or read gate, based on the calculated roundtrip write-to-read latency.

The roundtrip latency may be calculated by applying the write signal when the write mechanism is approximately over a calibration field 432 and the read mechanism is approximately over a quiet field 430. The quiet field 430 may be formatted to produce a negligible portion of the read signal from the quiet field 430 when compared to the write signal and the read signal sensed at the read element 304 includes a significant portion due to the coupling 340 between the write element 306 and the read element 304. In one example, the quiet field 430 may be prewritten with a direct current (DC) pattern.

The roundtrip latency may be determined based on a timing a signal takes to propagate between a first component of the write channel and a second component of the read channel. The first component may be the flip-flop 404 that operates as a latch to control when a signal is sent to the preamp 318 and the write element 306 based on the clock 402. The second component may be the analog to digital converter (ADC) 408. The ADC 408 and the clock 402 may provide timing data or timing signals to the latency calculation unit 412 to calculate the roundtrip latency, which may be stored in a buffer 414. Also, a write signal frequency 416 may be used to calculate the roundtrip latency. Also, additional components could be added to or removed from the write channel and the read channel when determining a roundtrip latency.

The roundtrip latency can be calculated at variable times during operation of the device. For example, the roundtrip latency may be calculated one or more times per revolution of a disc storage medium. The roundtrip latency may also be calculated after a number of revolutions of a disc data storage medium. Thus, the roundtrip latency may be calculated as frequently (or rarely) as desired. Further, the roundtrip latency may be calculated during a seek operation, or per every number of seek operations that a data storage device executes.

Once the roundtrip latency is calculated, the latency computation controller 420, the timing control 320, or other components may adjust a setting of the system 400 based on the calculated roundtrip latency. The device setting may be a timing correction for writing data to the medium 308. For example, bit patterned media can require precise timing of a write signal relative to a dot position under a write head for the correct writing of data and the loopback path calibration can frequently, without degrading performance of the data storage device, update a timing correction to be applied to write data.

Figure 5:
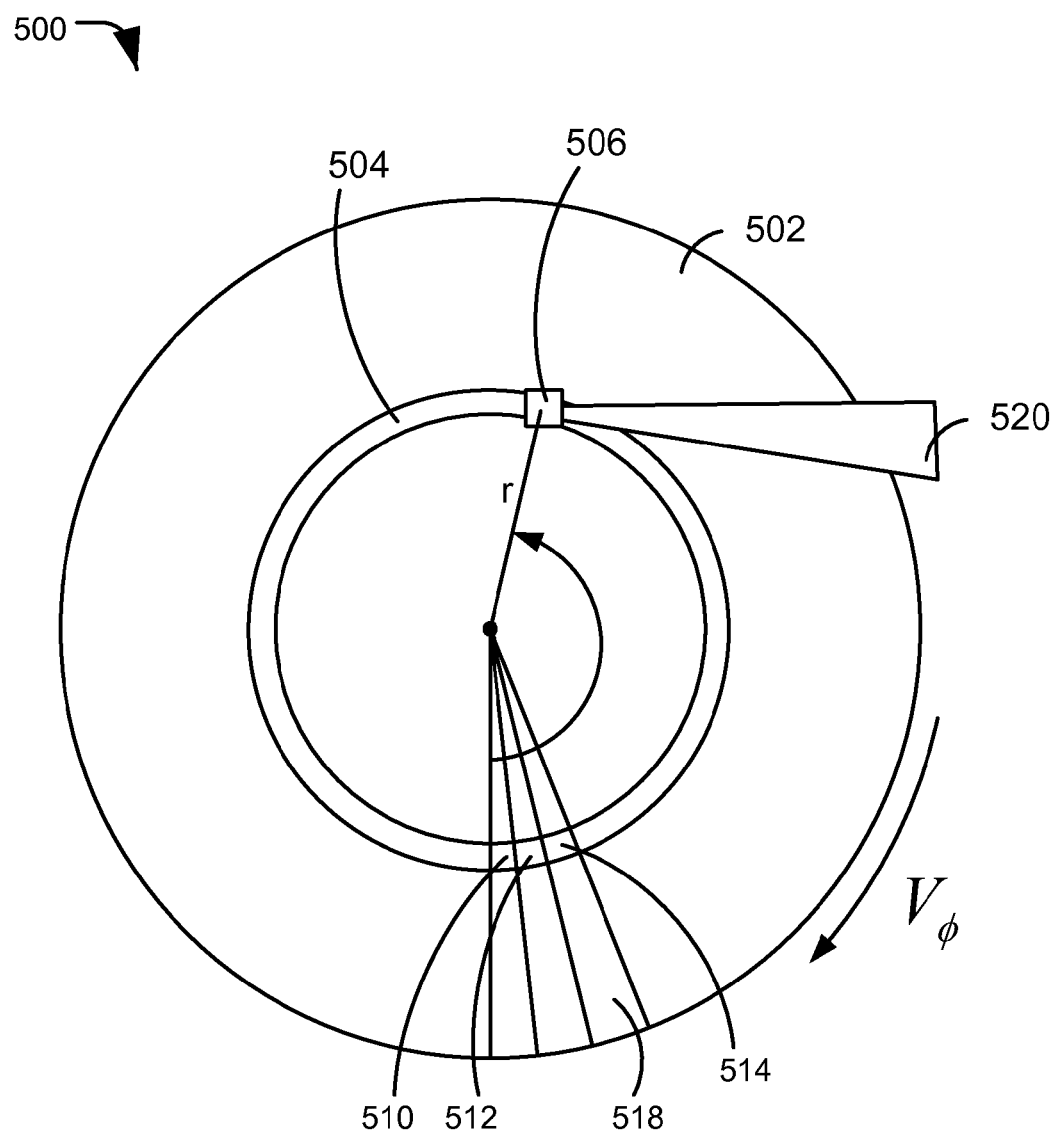
FIG. 5 is a diagram of an illustrative embodiment of a track format for measurement of latency.

Referring to FIG. 5, a particular embodiment of a track format for measurement of latency is shown and generally designated 500. The system 500 includes a data storage disc 502 that has multiple adjacent data tracks, including data track 504. A transducer or head 506, which can include a read element and a write element, may be positioned over one or more tracks, such as to read or write data to the track 504. In some embodiments, multiple adjacent tracks can each include a servo field 510, a quiet field 512, and a calibration field 514. Multiple calibration fields, which may be adjacent or have some spacing between them, can have similar angular positions to form a wedge 518 that can extend across multiple tracks. Although the wedge 518 shown in FIG. 5 is shown to span the entire disc, those skilled in the art will recognize that the wedges may start and end at any desired radial position as long as they include multiple tracks. Further, those skilled in the art will recognize that one or more of the wedges may be interrupted for one or more tracks. Although only a single quiet field is shown, in other embodiments, more than one quiet field can be present along a track as well as more than one calibration field. Each track may have quiet fields and calibrations fields or less than all tracks could have quiet fields and calibrations fields to perform the methods herein.

FIG. 5 shows the position of assembly 520 and the head 506 over the medium 502 and the track 504, where the medium 502 can move relative to assembly 520 at an angular velocity, $V_\phi$. The head 506 can have a radial position, r, measured from a disc center and an angular position, $\phi$, measured from a servo field 510.

Figure 6:
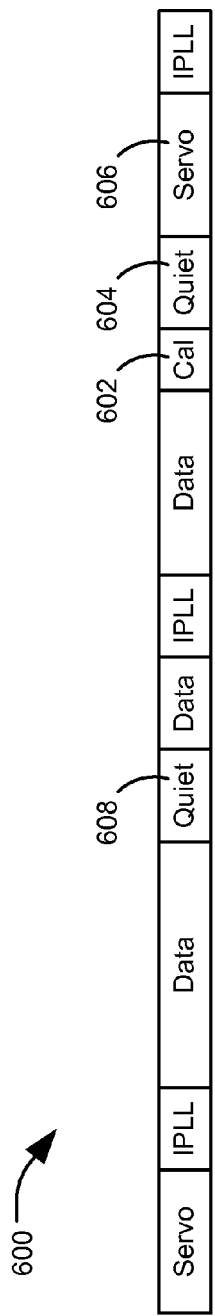
FIG. 6 is a diagram of another illustrative embodiment of a track format for measurement of latency.

Referring to FIG. 6, a diagram of another illustrative embodiment of a track format for measurement of latency is shown and generally designated 600. The track format 600 may include a calibration field 602 and a quiet field 604 near the calibration field 602. The calibration field 602 and the quiet field 604 may be areas of a data storage medium that are reserved and not to be used for storage of actual user data received from a host. The calibration field 602 or quiet field 604 may also be located near a servo field 606. The calibration field 602 and the quiet field 604 may be used for other purposes in addition to those described herein. In some embodiments, the relative placement of the calibration field to the quiet field may be based on a spacing between the read element and the write element.

Preferably, the desired affect is to have the read element sensing a read signal due to a coupling between the write element and the read element while not sensing a signal from the actual media. A read element and quiet field 604 can be configured such that a read from the quiet field 604 generates a negligible portion of the read signal due to the quiet field itself, where a significant portion of the read signal is generated due to coupling between the write data path and the read data path. The significant portion of the read signal may be generated due to a coupling mechanism or effect, such as parasitic coupling, intentional coupling, enabled coupling, or any combination thereof. To accomplish reading the coupling effect, having the area under the read element being quiet is one solution; that is, the quiet field may be an unused region that is preconditioned with a pattern, such as a DC pattern, so as to provide a negligible signal when the read element is activated. Thus, the calibration field 602 and quiet field 604 provide an area on a track where the roundtrip latency can be measured without destroying data when the write element is energized. A state of the media under the write element is largely irrelevant.

In some embodiments, the calibration field 602 and quiet field 604 can exist in multiple tracks of a disc to create a wedge on the disc. However, a wedge is not required, but placing the calibration and quiet fields in a wedge allows the calibration to be performed independent of cross-track location. Thus, by predefining and arranging the calibration fields to form a wedge on a disc, the roundtrip measurement operation can be performed at any crosstrack position, including during a seek when the crosstrack position may be rapidly changing.

Figure 7:
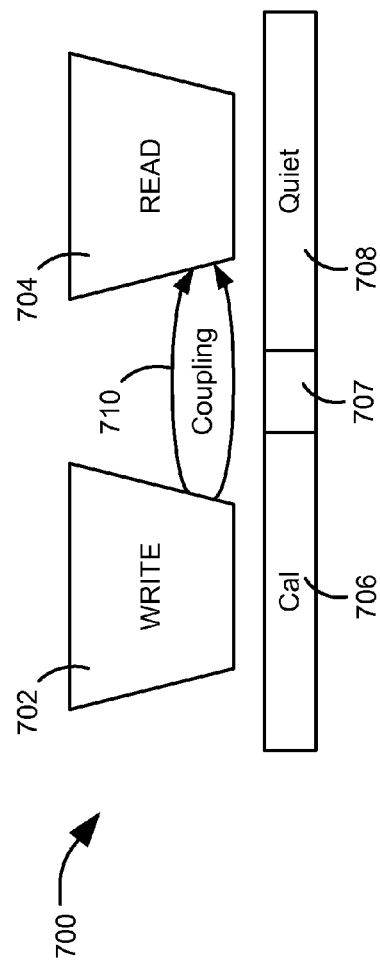
FIG. 7 is a diagram showing a relationship between a track format, a write mechanism, and a read mechanism.

Referring to FIG. 7, a system showing a relationship between a track format, a write mechanism, and a read mechanism for measurement of latency is shown and generally designated 700. The system 700 shows a write mechanism 702 and a read mechanism 704 positioned over a calibration field 706 and a quiet field 708, respectively. A roundtrip write-to-read latency can be calculated when the write mechanism 702 is over the calibration field 706 and the read mechanism 704 is over the quiet field 708. The system 700 may include a spacing 707 between the calibration field 706 and the quiet field 708. The spacing 707 may be based approximately on a spacing between the write element 702 and the read element 704; thus, the calibration field 706 and the quiet field 708 may be located in a relationship to each other based approximately on a spacing between the write element 702 and the read element 704.

Due to coupling 710 between the write mechanism 702 and the read mechanism 704 that exists when the write mechanism 702 is activated, the write mechanism 702 and associated write channel (not shown) can generate a signal that propagates to the write mechanism 702 and is detected by the read mechanism 704, which then propagates through an associated read channel (not shown). This allows a calculation of roundtrip latency that can be determined by measuring the time it takes the signal to propagate through the write channel and be received at the read channel. The write mechanism and the read mechanism can be active simultaneously, at least for a limited time, to allow the propagation (i.e. reading of the write signal due to coupling) to occur. Thus, the write signal can be detected, due to the coupling 710, by the read mechanism as the write mechanism and read mechanism are active simultaneously.

The system 700 may determine the roundtrip latency by utilizing parasitic coupling (i.e. naturally occurring coupling) in the head or may use intentional coupling in the head, which could be enabled for the roundtrip latency operations. The coupling may be selectively enabled to determine the roundtrip latency and the coupling can be enabled at variable times or by various triggers. The timing or trigger could be based on a number of revolutions of a disc, a number of commands, a timer, a level of workload of a device, a state of a device such as an idle state, a host request, a user request, or any combination thereof.

Figure 8:
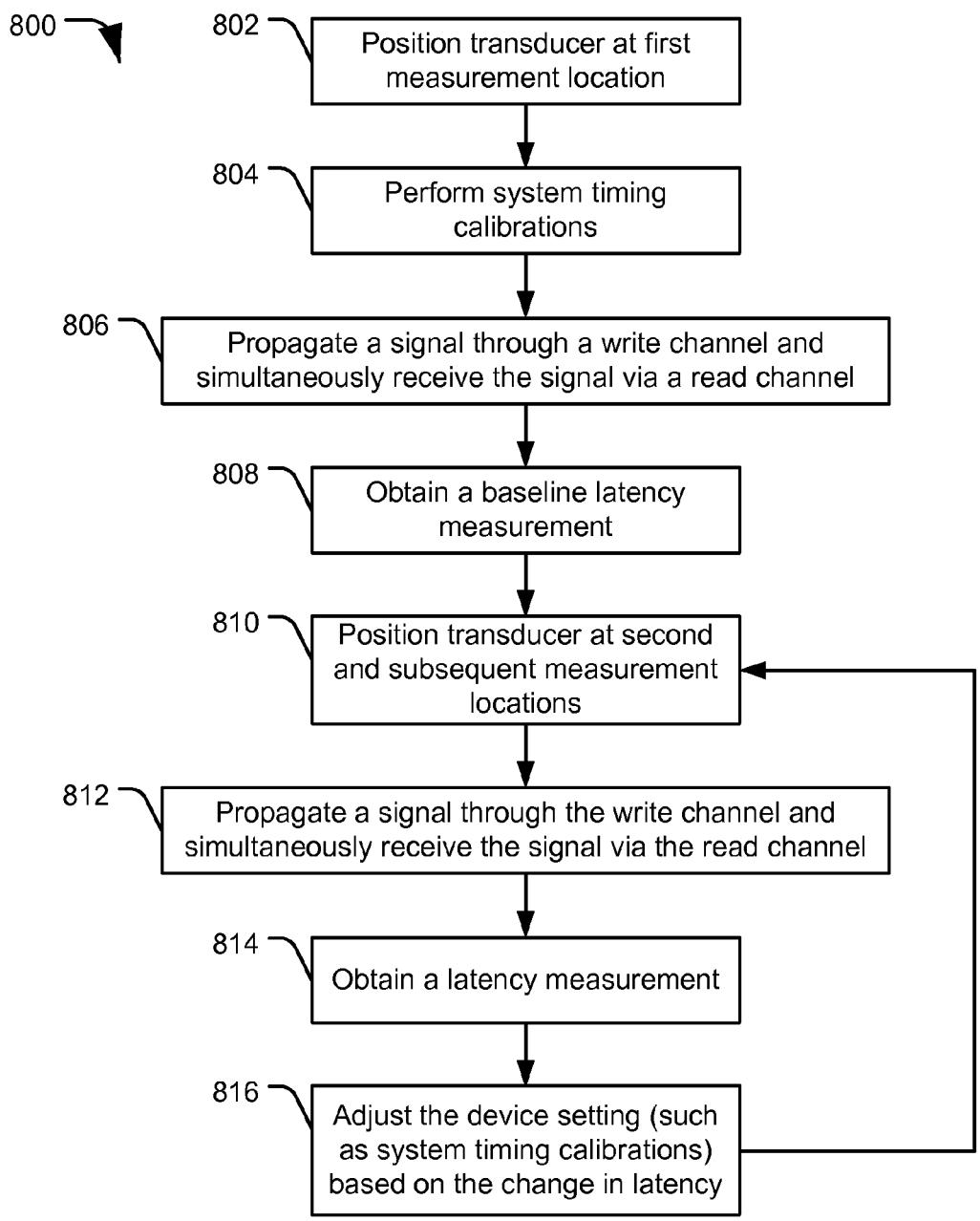
FIG. 8 is a flowchart of an illustrative embodiment of a method for measurement of latency.

Referring to FIG. 8, a flowchart of an illustrative embodiment of a method for measurement of latency is shown and generally designated 800. The method 800 may be used to calibrate a device based on a determined roundtrip write-to read latency. The method 800 may include positioning a transducer, such as a read/write head of a disc drive, at a first calibration location, at 802. The calibration location may include calibration and quiet fields as shown in FIGS. 4-7.

The method 800 may also perform system timing calibrations, at 804. The method may also include propagating a signal through a write channel while simultaneously receiving a read signal via a read channel, at 806. Then, a baseline latency measurement can be obtained, at 808, such as by measuring an amount of time needed to propagate the signal through the write channel and then receive it at the read channel. A baseline latency measurement or a baseline latency value may be an initial or baseline timing offset between a read element and a write element. The initial or baseline timing offset can be determined by writing to and reading from at least one part of a data storage medium (DSM), such as a disc. For example, in a disc based data storage device, this can include having a head pass the same position on the disc twice while writing to and reading from the same position on respective passes; though, this process may only need to be performed once to establish a baseline timing offset.

The method 800 may then position the transducer at second or subsequent measurement locations, at 810. Once at the next measurement location, a signal may be propagated through the write channel while simultaneously receiving a read signal via the read channel, at 812. A latency measurement may then be obtained, at 814. From the baseline latency measurement and the current latency measurement, a change in latency may be determined and a device setting, such as system timing calibrations, may be adjusted, at 816. For example, in a disc data storage device, the method 800 may update the calibration of the write phase for data written to the disc, adjust to position calibrations, adjust timing calibrations, make other adjustments, or any combination thereof. The method 800 may then repeat, at 810, as often as updating the device settings is desired, though the repeating may be the whole method 800 also. A latency measurement may be obtained by determining a combined latency of the read and write path. A write signal can travel through the write path and induce a field in a head including a write element. When reading is activated simultaneously to the write element inducing the magnetic field, a read element of the head can detect a read signal predominately based on the magnetic field and/or electric field coupling between the write element and the read element. Such read signal can return along the read path and the time it takes from the write signal being propagated and the read signal to return can be the combined latency of the read path and the write path.

The method 800 may be performed at various frequencies. For example, the method 800 may be performed for each rotation of a disc or greater. Thus, the combined latency (or roundtrip latency) can be updated or recalibrated frequently or as often as needed. This updated roundtrip latency can be used to adjust device settings, such as write times, which represent relative time points when a write gate signal should be applied, update the calibration of the write phase for data to be written, or other adjustments.

A relationship exists between the roundtrip latency and write timing. This relationship can be based on the difference between when the write gate signal is applied and when data is actually written as well as the difference between when data is read and when the read signal reaches the end of the read path.

After a write gate signal is applied, there is a write propagation delay $\Delta t_w$ associated with the write signal propagating through the write path. This results in the write signal being written at a later time $t_{wA}$. Similarly, there is a propagation delay $\Delta t_r$ associated with the read signal propagating through the read path. This means that the read signal is actually read at time point $t_{rA}$. Thus, the actual times, $t_{rA}$ and $t_{wA}$, at which data are read from and written to a medium are separated from each other by a time equal to the timing offset $t_w - t_r$, plus the sum of the write propagation delay $\Delta t_w$ and the read propagation delay $\Delta t_r$. In terms of an equation:

$$t_{wA} - t_{rA} = (t_w - t_r) + (\Delta t_w + \Delta t_r) \qquad \text{Equation 1}$$

The sum of the write propagation delay $\Delta t_w$ and the read propagation delay $\Delta t_r$ equals the latency $\Delta t$ of the combined write path and read path and the difference, $t_w - t_r$, is the timing offset $\tau$. Thus, Equation 1 can be rewritten as:

$$\Delta t = (t_{wA} - t_{rA}) - \tau \qquad \text{Equation 2}$$

For a disc data storage medium, the term, $(t_{wA} - t_{rA})$, is a function of the physical circumferential distance, $D_{offset}$, between the write element and the read element, the angular velocity of the disc and the radial position of the elements. Under one embodiment, this term is computed as:

$$(t_{wA} - t_{rA}) = \frac{D_{offset}}{rV_\phi} \qquad \text{Equation 3}$$

where r is the radial position of the elements, and $V_\phi$ is the angular velocity of the disc.

To determine an estimate of the value of the physical circumferential distance, $\hat{D}_{offset}$, between the write element and the read element, the baseline timing offset, $\Delta t_b$, and the estimated baseline latency, $\hat{\tau}_b$, can be used. Specifically:

$$\hat{D}_{offset} = rV_{\phi b}(\Delta t_b + \hat{\tau}_b) \qquad \text{Equation 4}$$

where $V_{\phi b}$ is the angular velocity during the determination of the baseline timing offset and the baseline latency. Thus, Equation 1 can be rewritten as:

$$\Delta t = (t_w - t_r) = \frac{(\tau_b + \Delta t_b)V_{\phi b}}{V_\phi} - \tau \qquad \text{Equation 5}$$

or $$t_w = \frac{(\tau_b + \tau_b)V_{\phi b}}{V_\phi} - \tau + t_r \qquad \text{Equation 6}$$

where $t_r$ is the time at which a read signal generated from the desired location would be expected to appear at the end of the read path. This time may be computed based on the timing offset between a servo field or phase-locked loop (PLL) field and a desired position on a disc. As noted above, write times may be updated once per revolution of a storage medium or multiple times per revolution of the storage medium.

Figure 9:
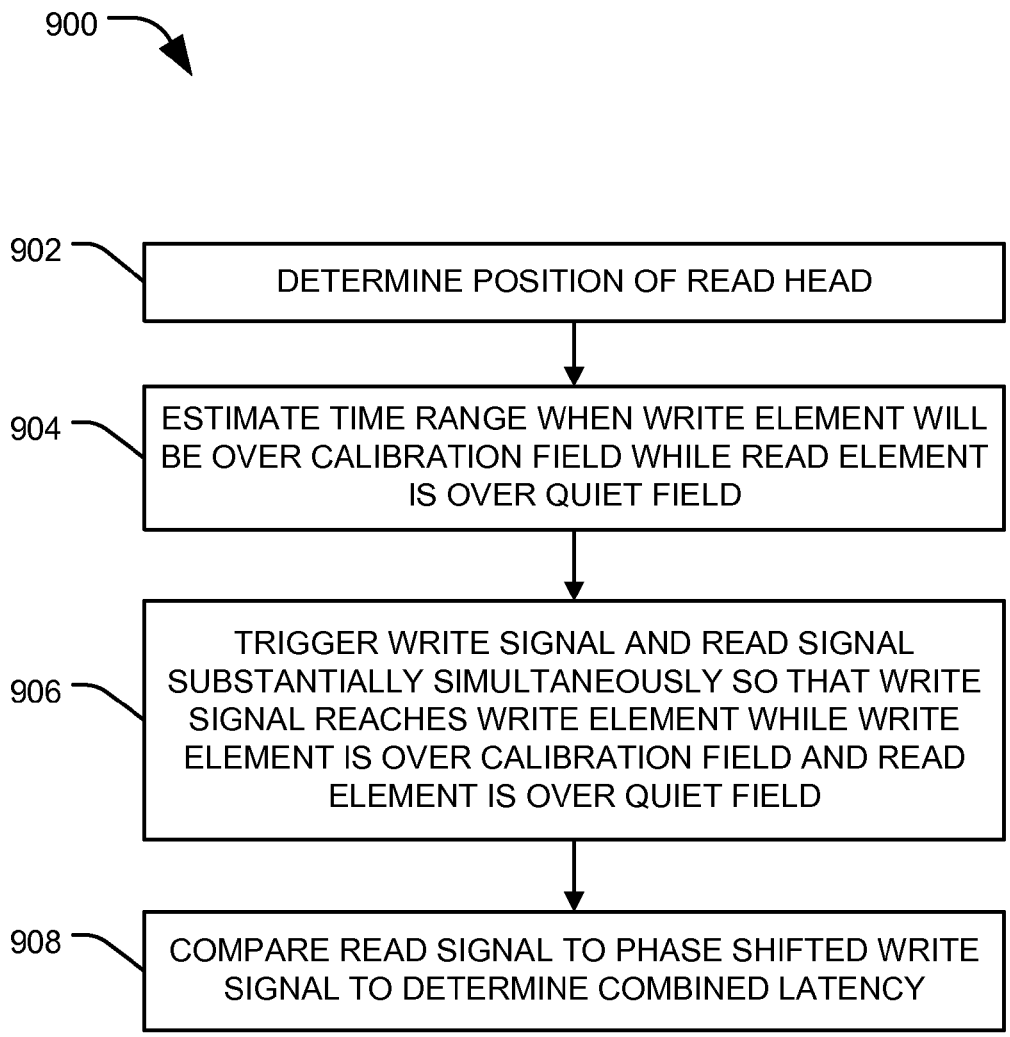
FIG. 9 is a flowchart of another illustrative embodiment of a method for measurement of latency.

Referring to FIG. 9, an illustrative embodiment of a method for measurement of latency is shown and generally designated 900. The method 900 can determine a roundtrip read/write latency of a data storage device, such as in a disc drive.

A servo field or PLL field can be read to determine a circumferential position of a head, at 902. Then, an estimate of when a write element will be over a calibration field while a read element is over a quiet field can be determined, at 904. This may be accomplished by a timing control based on known field offsets, angular velocity, and a timing offset. Specifically, the field offsets can indicate an angular distance between various fields on a track, which can be used with the angular velocity to determine when the read element should be over a particular field. A timing offset indicates when a write signal should be applied to the write element to write to a particular field given the position of the read element.

A timing control can trigger a write gate signal and a read gate signal so that a write signal reaches a write element to write to a calibration field while the read element is over a quiet field, at 906. The writing and reading may be triggered at different times as long as they are both put into an active state substantially simultaneously for at least some time. The active state of a write signal can be a state that instructs a preamp to drive a write signal to a write element and the active state of a read signal can be a state that instructs a preamp to amplify a read signal received from a read element.

In some embodiments, the quiet field can be a portion of a data storage medium, such as a magnetic disc, that produces a negligible read signal in the read element. Thus, when the write signal and the read signal are both active while the read element is over the quiet field, the preamp can amplify a read signal that is for the most part formed by coupling (e.g. magnetic field or electric field coupling) between the write element and the read element. This coupling does not involve connecting a conducting material between the write element and the read element. Instead, it involves magnetic and/or electric fields spanning the space between the write element and the read element. This coupling is also not based on the write element writing data to the medium and the read element later reading that data. Instead, the coupling is based on direct fields generated by the write element that are directly detected by the read element, instead of the fields that alter a portion of a data storage medium that could be later detected by the read element.

A roundtrip latency can be determined, at 908. For example, the roundtrip latency can be determined by comparing the read signal generated through the direct coupling to a delayed or phase shifted version of the original write signal. The roundtrip latency may also be determined by other methods, such as through timing data or timing signals associated with the propagated signals.

The illustrations of the embodiments described herein are intended to provide a general understanding of the structure of the various embodiments. The illustrations are not intended to serve as a complete description of all of the elements and features of apparatus and systems that utilize the structures or methods described herein. Many other embodiments may be apparent to those of skill in the art upon reviewing the disclosure. Other embodiments may be utilized and derived from the disclosure, such that structural and logical substitutions and changes may be made without departing from the scope of the disclosure. Moreover, although specific embodiments have been illustrated and described herein, it should be appreciated that any subsequent arrangement designed to achieve the same or similar purpose may be substituted for the specific embodiments shown.

The illustrations and examples provided herein are but a few examples of how the present disclosure can be applied to data storage systems. There are many other contexts in which the methods and systems described herein could be applied to computing systems and data storage systems. For example, the methods and systems described herein are particularly useful for data storage devices to make self correcting calibration changes based on write-to-read latency.

This disclosure is intended to cover any and all subsequent adaptations or variations of various embodiments. Combinations of the above embodiments, and other embodiments not specifically described herein, will be apparent to those of skill in the art upon reviewing the description. Additionally, the illustrations are merely representational and may not be drawn to scale. Certain proportions within the illustrations may be exaggerated, while other proportions may be reduced. Accordingly, the disclosure and the figures are to be regarded as illustrative and not restrictive.

What is claimed is:

1. A device comprising:
   a write mechanism to write user data to a data storage medium;
   a read mechanism to read user data from a data storage medium;
   a circuit adapted to:
      calculate a roundtrip write-to-read latency based on an application of a write signal to the write mechanism and a receipt of a read signal via the read mechanism approximately simultaneously with the application of the write signal; and
      adjust a device setting based on the calculated roundtrip write-to-read latency.

2. The device of claim 1 wherein the circuit is further adapted to calculate the roundtrip latency by applying the write signal when the write mechanism is approximately over a calibration field and the read mechanism is approximately over a quiet field, where the quiet field is adapted to produce a negligible portion of the read signal from the quiet field when compared to the write signal and the read signal also includes a significant portion due to coupling between the write mechanism and the read mechanism.

3. The device of claim 2 further comprising the data storage medium, where the data storage medium includes a track format that includes the calibration field and the quiet field located in a relationship to each other that corresponds to a spacing between the write mechanism and the read mechanism.

4. The device of claim 3 wherein the data storage medium comprises a disc having multiple tracks, each track having a calibration field, and each of the calibration fields in the multiple tracks having a similar angular position to form a wedge across the multiple tracks.

5. The device of claim 4 wherein the disc data storage medium further comprises a bit patterned magnetic data storage medium.

6. The device of claim 3 further comprising the roundtrip write-to-read latency is calculated at variable times during operation of the device.

7. The device of claim 2 wherein the quiet field is prewritten with a direct current (DC) pattern.

8. The device of claim 2 wherein the circuit is further adapted to calculate the roundtrip write-to-read latency during a seek operation.

9. The device of claim 2 further comprising adjusting a write data phase of a write signal based on the roundtrip write-to-read latency.

10. The device of claim 1 wherein the circuit is further adapted to calculate the roundtrip write-to-read latency during writing of user data and calculate the roundtrip write-to-read latency based on a data pattern of the user data.

11. A method comprising:
applying a write signal to a write data path for writing data to a data storage medium;
receiving a read signal via a read data path, the read signal generated at least partially due to coupling between the read data path and the write data path;
calculating a combined latency of the write data path and the read data path based on applying the write signal to the write data path and receiving the read signal at the read data path approximately simultaneously; and
adjusting a device setting based on the combined latency.

12. The method of claim 11 further comprising calculating the combined latency by applying the write signal to a calibration field while a read element is configured to read from a quiet field that generates a negligible portion of the read signal due to the quiet field itself, where a significant portion of the read signal is generated due to coupling between the write data path and the read data path.

13. The method of claim 12 further comprising calculating the combined latency when the write element is approximately over the calibration field and the read element is approximately over the quiet field, where the calibration field and the quiet field are located in a relationship to each other that is based on a spacing between a write element and the read element.

14. The method of claim 12 wherein the coupling is parasitic coupling between the write data path and the read data path.

15. The method of claim 12 wherein the coupling is intentional coupling between the write data path and the read data path.

16. The method of claim 12 wherein the coupling is coupling that is selectively enabled to determine the combined latency, where the coupling can be enabled at variable times.

17. A system comprising:
a data storage medium;
a write element adapted to store data to the data storage medium;
a read element adapted to read data from the data storage medium;
a circuit adapted to:
calculate a roundtrip latency based on applying a write signal to the write element and receiving a read signal via the read element approximately simultaneously, the read signal generated at least partially due to coupling between the write element and the read element; and
adjust a setting of the system based on the calculated roundtrip latency.

18. The system of claim 17 further comprising a transducer including the write element and the read element, where the transducer is used to determine the roundtrip latency and read and write user data to the data storage medium, wherein user data comprises data other than used for determining the roundtrip latency, and wherein a significant portion of the read signal used for calculating the roundtrip latency is due to coupling between the write element and the read element.

19. The system of claim 18 wherein the data storage medium further comprises a disc data storage medium having tracks, at least a portion of the tracks include a track format that includes a calibration field and a quiet field located in a relationship to each other based approximately on a spacing between the write element and the read element, the quiet field comprising a pattern that produces a pre-determined read signal that is a negligible portion of the read signal used for calculating the roundtrip latency, and the circuit is further adapted to calculate the roundtrip latency when the write element is approximately over the calibration field and the read element is approximately over the quiet field.

20. The system of claim 17 further comprising calculating the combined latency by applying the write signal to a calibration field while a read element is configured to read from a quiet field that generates a negligible portion of the read signal due to the quiet field itself, where a significant portion of the read signal is generated due to coupling between the write data path and the read data path.

* * * * *